United States Patent [19]

Iversen et al.

[11] Patent Number: 4,989,070
[45] Date of Patent: Jan. 29, 1991

[54] MODULAR HEAT SINK STRUCTURE

[75] Inventors: Arthur H. Iversen, Saratoga; Stephan Whitaker, Davis, both of Calif.

[73] Assignee: Coriolis Corporation, Saratoga, Calif.

[21] Appl. No.: 269,882

[22] Filed: Nov. 10, 1988

[51] Int. Cl.⁵ .................. F28F 13/00; H01L 23/34
[52] U.S. Cl. ................................. 357/82; 165/135; 361/385
[58] Field of Search ................................. 357/82

[56] References Cited

U.S. PATENT DOCUMENTS

| | | | |
|---|---|---|---|
| 4,341,432 | 7/1982 | Cutchaw | 174/16.3 |
| 4,622,687 | 11/1986 | Whitaker et al. | 378/141 |
| 4,684,844 | 8/1987 | Iversen | 313/30 |
| 4,696,481 | 9/1987 | Iversen | 277/80 |
| 4,712,609 | 12/1987 | Iversen | 165/135 |
| 4,799,543 | 1/1989 | Iversen et al. | 165/135 |
| 4,884,169 | 11/1989 | Cutchaw | 357/82 |
| 4,944,344 | 7/1990 | Crowe | 361/385 |

FOREIGN PATENT DOCUMENTS

| | | | |
|---|---|---|---|
| 0075180 | 6/1977 | Japan | 357/82 |
| 0198649 | 12/1982 | Japan | 357/82 |
| 0018159 | 1/1986 | Japan . | |

OTHER PUBLICATIONS

J. Riseman, "Structure for Cooling by Nucleate Boiling", IBM TDB, vol. 18, No. 11, Apr. 76, p. 3700.

Primary Examiner—Andrew J. James
Assistant Examiner—Viet Q. Nguyen
Attorney, Agent, or Firm—Foley & Lardner

[57] ABSTRACT

There is disclosed a novel high heat flux liquid cooled semi-conductor heat sink of modular construction suitable for semi-conductor chips such as IC's, hybrids, lasers, and power semi-conductors, said modular heat sink containing inserts with chip substrates made of metals, such as tungsten or molybdenum, said substrate including at least one surface suitable for bonding one or more semi-conductor chips in intimate thermal relationship thereto, and including a heat exchange surface on the interior surface thereof, said module providing means for enclosing said heat exchange surface in a liquid tight manner and including means for providing a flow of coolant liquid to remove heat from said heat exchange surface by formation of nucleate vapor bubbles on said heat exchange surface, the improvement wherein said heat sink module comprises individual heat sink inserts upon which semi-conductor chips are intimately bonded, said heat sink element being provided with means to electrically isolate each heat sink element from all other heat sink elements mounted on said heat sink module, said heat sink elements having their corresponding liquid cooled surface directly opposing said semi-conductor chip, the heat transfer characteristics of said liquid cooled surface being unobstructed by said electrically isolating means.

12 Claims, 5 Drawing Sheets

MODULAR HEAT SINK STRUCTURE

TECHNICAL FIELD

The present invention relates to boiling heat transfer and particularly concerns means for the efficient cooling of semi-conductor devices.

BACKGROUND OF THE INVENTION.

The need for more efficient heat removal from semi-conductor devices has become more important as design rules for IC's shrink and power levels of power devices such as diodes and SCR's increase. Bipolar and power MOS FET's devices are high in power consumption, and thus as rule size decreases to increase device density and speed, heat flux increases.

The need exists for semi-conductor heat removal structures that can handle higher heat fluxes, are more compact and less costly.

SUMMARY OF THE INVENTION

The present invention provides for an electrically isolated semi-conductor heat sink.

The present invention provides for an electrically isolated semi-conductor heat sink that permits multiple units to be conveniently mounted on a single structure.

The present invention provides for a heat sink that may be readily removed and replaced.

The present invention provides for a boiling heat transfer surface wherein temperature overshoot may be minimized.

The present invention provides a liquid cooled semi-conductor heat sink that can dissipate heat flux that is an order of magnitude greater than currently available.

The present invention provides a liquid cooled semi-conductor heat sink that is smaller and lighter than high flux heat sinks currently in use.

The present invention further provides a liquid cooled semi-conductor heat sink that enables efficient use of dielectric liquid coolants thereby avoiding the electrical leakage and corrosion that can result from the use of water coolant.

The present invention provides a liquid coolant semi-conductor heat sink that enables uniform temperature operation of semi-conductor devices.

The present invention provides a liquid cooled semi-conductor heat sink of efficient operation that enables the choice of coolant to be made on the basis of non-toxicity or other criteria and not on thermal efficiency considerations.

The present invention provides a liquid cooled semi-conductor heat sink that operates effectively in a zero gravity environment and in a negative gravity environment.

DESCRIPTION OF THE PREFERRED EMBODIMENT

Figure 1:
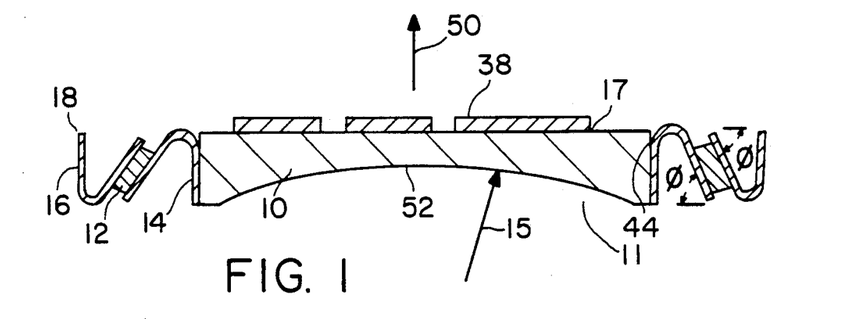
FIG. 1 is a cross section view of a heat sink insert.

Referring now to FIG. 1, which illustrates a heat sink insert 11, shown is a semi-conductor chip substrate 10 suitable for mounting one or more semi-conductor chips 38, which may, for example, be I.C.'s, hybrids, lasers or power devices or any combination thereof. In general, it is desirable that the substrate 10 have high thermal conductivity and have a thermal coefficient of expansion that adequately matches that of the semi-conductor chip material, be it silicon, germanium, gallium arsenide or other III–IV semi-conductor compounds. In addition, the substrate should have sufficient mechanical strength to permit handling, sealing to other structures, etc. Suitable materials include metals such as molybdenum, tungsten and zirconium.

Substrate 10 may be square, rectangular or other desirable shape, preferably with rounded corners to minimize stresses induced in the insulating joint 12. A corresponding square, rectangular member, also with rounded corners and approximately "U" shaped cross section thin walled metal (e.g. .010 Kovar) member 14 hereinafter sometimes referred to as rings is bonded, preferably hermetically, to chip substrate 10 by suitable means such as brazing or welding. A correspondingly shaped insulating member 12, which may be ceramic, glass or other suitable insulating material is bonded, preferably hermetically, to "U" ring 14. Correspondingly shaped and generally "U" shaped cross section thin walled metal member 16 (ring) is bonded, preferably hermetically, to insulating member 12. Rim 18 of ring 16 is bonded, preferably hermetically, to heat sink module 13 at rim 21 (FIG. 5) by suitable means such as welding, e.g. heliarc, laser, electron beam etc. or brazing. Rim 21 conforms to the geometry of rim 18, e.g. rectangular with rounded corners.

To seal ring 14 to substrate 10, e.g. molybdenum, it is desirable to reasonably match the coefficients of expansion of the two metals. In addition, the coefficients of expansion of rings 14, 16 should properly match insulating joint 12, e.g. glass, ceramic or composites. Composites may include high temperature ceramic or glass-plastic compositions etc. Suitable ring 14, 16 material includes Kovar and Rodar, which are designed to seal to glass, e.g. Corning 7052, and which also work with ceramics, such as alumina. Any number of glass compositions and corresponding sealing glasses may be selected depending upon desired characteristics such as sealing temperatures, electrical characteristics, strength etc. In general, glass seals are more economical than ceramic seals. The wall thickness of rings 14, 16 is generally thin, e.g. .005" to .020", for both economy and to provide "give" upon differential expansion due to heating and cooling.

Fabrication of heat sink insert 11 of FIG. 1 might proceed as follows. Rings 14, 16 made of glass sealing alloy such as Kovar are suitably prepared, e.g. pre-oxidized, for sealing to glass insulator 12, e.g. Corning 7052 glass. Thin wall metals may be readily stamped into the desired shapes. Thin walled glass tube 12, e.g. .003" to .030" is formed into an approximately truncated cone whose angle $\phi$ approximately matches that of rings 14, 16. The angle $\phi$ is generally from 40° to less than 90°.

Figure 2:
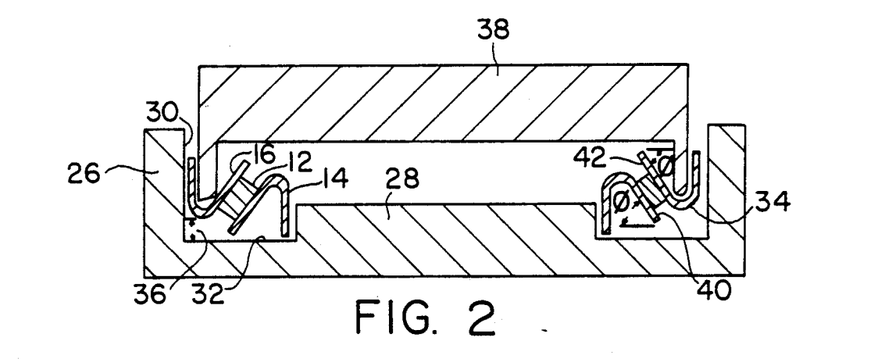
FIG. 2 is a cross section view of a glazing fixture to fabricate the heat sink insert insulating sub-assembly.

In FIG. 2, ring 14 is first mounted in glazing fixture 26 and is centered by post 28. Glass ring 12 is then positioned over ring 14. Ring 16 is thin positioned over glass ring 12, ring 16 being aligned by wall 30 of fixture 26. Pressure means such as weight 38 is then positioned on ring 16. In fixture 26, post 28 and wall 30 insure concentricity of rings 14, 16 and surface 32 insures parallelism. With properly designed tooling, accurate alignment can be achieved, and manufacturing can be automated.

When ring 16 is seated on glass ring 12, ring 16 surface 34 does not touch fixture surface 32, but sits above it a distance 36. A number of loaded fixtures 26 are then placed in a controlled atmosphere furnace and brought up to temperature. Glass ring 12 melts and fuses to rings 14, 16. As glass 12 softens, ring 16 is forced down by pressure means 38, e.g. a weight, until surface 34 of ring 16 touches surface 32 of fixture 26. Rings 14, 16 are now concentric and parallel, and hermetically sealed to each other by glass ring 12. Weight 38 forces angle $\phi$ surface 42 of ring 16 against melted glass ring 12 as it moves toward fixture surface 32. In turn, this force is transmitted through melted glass ring 12 to angle $\phi$ surface 40 of ring 14 which insures a proper seal. Upon cooling the insulated seal sub-assembly comprising bonded metal and glass elements 14, 12 and 16 are chemically or otherwise cleaned to provide bare metal surfaces for subsequent plating e.g. nickel, brazing, welding etc.

For low frequency applications the choice of insulating material 12 is not critical nor is the geometry of substrate 10 and rings 14, 16. At high frequencies, e.g. microwave, the thickness, dielectric constant, loss tangent etc. of insulator 12 and the geometry, e.g. round, square, rectangular etc. of substrate 10 and rings 14, 16 would be optimized to minimize power losses and to optimize the VSWR (Voltage Standing Wave Ratio) at the operating frequencies. In general, angle $\phi$ of surfaces 42, 40 and insulating member 12 are equal which provides an approximately constant wall thickness of insulating material 12. In certain applications such as RF matching, it may be desirable that the angle $\phi$ for surfaces 42 and 40 not be equal thereby yielding a variable wall thickness in insulating member 12. When insulator 12 is glass, the appropriate shape is obtained upon melting. When insulator 12 is ceramic, the shape must be prepared by grinding and metalizing, prior to brazing.

The next step is to braze substrate 10, made of molybdenum for example, to insulated seal sub-assembly comprising 14, 12, 16. Prior to brazing, substrate 10 may be provided with a thin plate of suitable material, e.g. nickel 1 to 40 microns thick, to facilitate brazing with a broad range of brazing alloys. In addition, the nickel plate serves as the bonding surface for the silicon chip solder joint. Very few brazing alloys will bond directly to molybdenum. The chip 38 to substrate 10 braze 17, ring 14 to substrate 10 braze 44 may be brazed simultaneously, or the braze joints may be made sequentially. In a step braze procedure, each subsequent braze or bond is done at a lower temperature than the preceding braze or bond so as to prevent re-melting and possible loss of the prior braze or bond. The completed heat sink insert 11 with mounted chips 38 is shown in FIG. 1.

Figure 3:
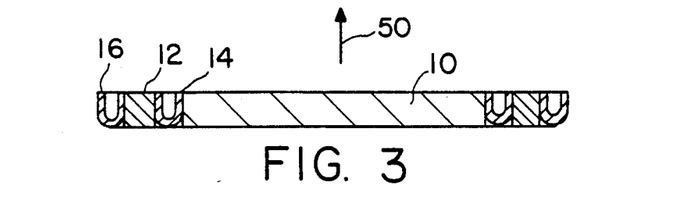
FIG. 3 is a cross section view of a heat sink insert incorporating a ceramic insulator.

To use a ceramic insulator 12 instead of glass, a cylindrical cross section as shown in FIG. 3 is preferred. Rings 14, 16 now preferably have a "U" or other suitable shape to match insulator 12. Ceramic 12 and rings 14, 16 are brazed together in a manner similar to that shown in FIG. 2.

Figure 4:
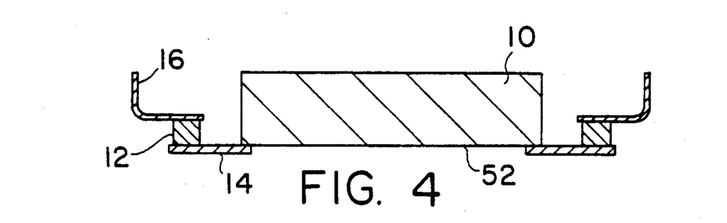
FIG. 4 is a cross section view of an alternate heat sink insert design.

In general, when internal pressure in the semi-conductor module 13 generates a force 50 (FIGS. 1, 3) caused by heated coolant, it is desirable that the electrical isolation assembly have a strong glass or ceramic bond. Strength is achieved in shear with a cylindrical section ceramic 12 (FIG. 3) with outward force 50 as shown. For the glass insulator 12 (FIG. 1), the angle $\phi$ should be close to 90°, e.g. 45° to approaching 90° for force 50 shown. The angle $\phi$ is determined by the characteristics of the glass 12 to metal 14, 16 seal and the fixturing used. The seals shown in FIGS. 1, 3 have high shear strength when subjected to force 50. Alternative designs, such as FIG. 4, would have a lower strength glass or ceramic 12 insulator to metal 14, 16 seal when subjected to force 50, but would have certain design advantages.

A problem encountered with heat exchange surfaces incorporating dielectric coolants in boiling heat transfer is that of temperature overshoot in that after several on-off power cycles, the nucleating cavities on the heat exchange surface are flooded with coolant, the non-condensable gases normally present in said cavities having been substantially displaced by the low surface tension, low contact angle dielectric liquids. The geometry and distribution of cavities 72 on heat exchange surface 52 is designed to provide optimum heat transfer. Nucleate boiling heat exchange surfaces using fluorocarbon liquids are especially prone to temperature overshoot. To initiate nucleate boiling, superheats, hereinafter sometimes called the initiating superheat, as high as 80° C. may be required when using fluorocarbons. Upon establishment of steady nucleate boiling, the $\Delta T$ superheat returns to its normal value.

Means whereby the temperature overshoot may be reduced include reducing the initiating superheat. This may be accomplished by locally reducing the pressure directly over the nucleating cavity which in turn initiates nucleate boiling at a lower superheat. This pressure reduction may be obtained by causing the coolant streamlines to follow a curved path directly over the cavity thus taking advantage of the Bernoulli effect. Curved coolant streamlines may be induced by protrusions which are preferably part of the cavity geometry. We refer to these as effects as microcurvature effects to distinguish them from the macrocurvature of the heat transfer surface shown in FIG. 1.

Figure 8:
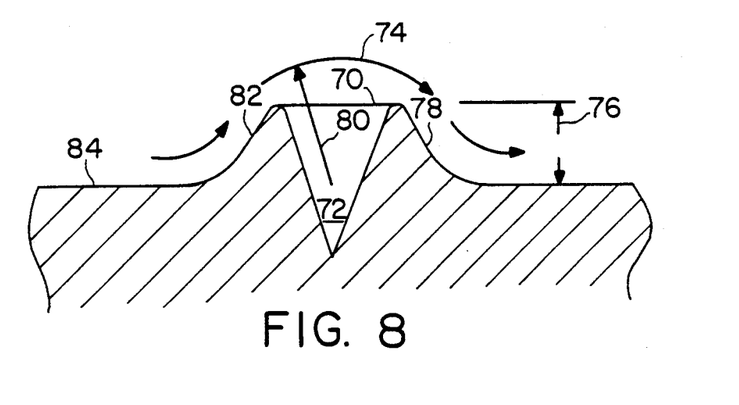
FIG. 8 is a cross section view of a protrusion illustrating a nucleating cavity on a liquid cooled heat exchange surface that is designed to generate curved streamlines over the throat or throats of nucleating cavities.

In general, for best effect, the height of the protrusions extends at least above the viscous sublayer and into the transition zone, and may also extend into the main flow region. In general, it is desirable to encompass cavity 72 with protrusion 78, the throat 70 of cavity 72 being exposed to coolant flow as shown in FIG. 8. The outer surface of protrusion 78 is shown as concave 82 so as to promote curved streamlines 74. The distribution of cavities 72 and protrusions 78 on heat exchange surface 52 is such so as to obtain optimum heat transfer rates. Other geometries of protrusion 78 may prove optimum depending on coolant parameters such as velocity, density, viscosity, surface tension, temperature etc.

Figure 9:
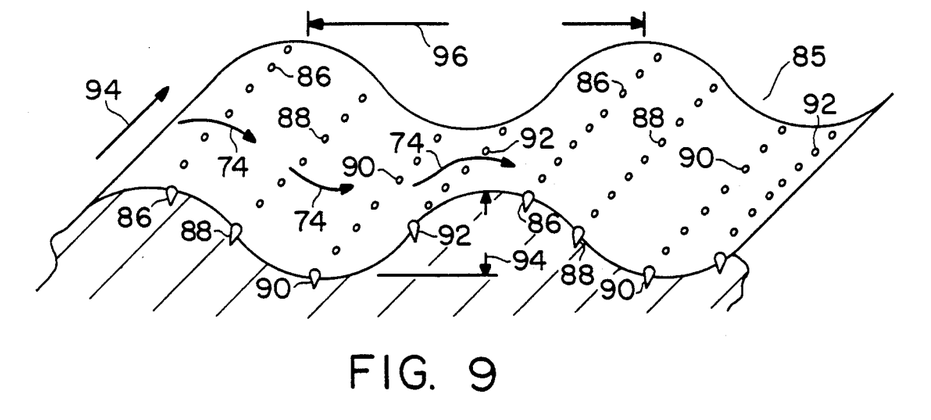
FIG. 9 is a perspective view of an undulating heat exchange surface prepared with nucleating site cavities.

A further preferred embodiment to reduce the initiating superheat is shown in FIG. 9. Heat transfer surface 52, for both curved and linear surfaces, is caused to undulate 85 in the direction of coolant flow 74 with the undulations projecting linearly in the direction 94 orthogonal to coolant flow 74, that is, undulations 85 are elongated in direction 94. For discussion purposes, cavity 86 is shown at the peak of the undulation, cavity 88 on the downstream slope, cavity 90 in the trough and cavity 92 on the upstream slope. In general, cavity distribution will be denser than described above. Coolant streamlines 74 are shown concave over the line of cavities 86 along the peak of undulations 85 thus lowering the pressure by the Bernoulli effect and triggering nucleate boiling. Cavities 88 on the downstream side of undulation 85 will experience a lower local pressure drop than cavities 86. Cavities 90 in the trough of undulation 85 will see a small pressure increase while cavities 92 in the upstream surface will see a pressures increase.

Nucleate boiling will commence with cavities 86 which have the lowest pressure over the cavities. The localized intense turbulence generated by the nucleate bubbles combined with the sweep of nucleate bubbles over cavities 88 will trigger nucleate boiling in cavities 88. In like manner, nucleate boiling will be triggered successively in cavities 90 and then 92. Once nucleate boiling commences with cavities 86, streamlines 74 tend to be broken up and local turbulence at the nucleating sites increasingly predominates. Under these conditions the curved streamlines 74 illustrated in FIGS. 8 and 9 are completely disrupted and the microcurvature effects no longer influence the heat transfer process. Heights 94, that is, peak-to-peak, of the undulating surface 85 may range from 0.001 mm to 0.5 mm and the period 96 of undulations 85 may range from 0.005 mm to 5 mm.

Cavities 72 and related protrusions 78 may be made by a number of methods. For minute cavities and protrusions of micron and sub-micron dimensions with high packing densities Electrical Discharge Texturing (EDT), a variant of Electrical Discharge Machining (EDM), may be used. Other methods such as chemical milling or laser drilling may be used for larger cavities and protrusions. Reactive chemicals may be added to the above processes to promote desired protrusion and cavity geometries during surface preparation.

At the throat 70 of cavity 72 in FIG. 8, the pressure in the liquid is lowered by an amount:

$$\Delta P \sim p\, v^2 h/r$$

where p is the liquid density, v is the coolant velocity 74, h the height 76 of the protrusion 78 and r the radius of microcurvature 80 of the coolant streamlines 74 passing over cavity 72. The streamlines 74 are shown as concave curved with respect to cavities 72. The geometry of the protrusions 78 are made such as to optimize the radius of curvature 80 of the streamlines 74. If the radius of curvature of the streamlines is too small as might occur with a sharp protrusion, the streamlines could break up, vortex shedding could take place etc., thus rendering the protrusions less effective.

Maximum effectiveness of the protrusions 78 is achieved when they protrude above the viscous sublayer into the transition zone. That is, since the local pressure decrease caused by the Bernoulli effect is proportional to $v^2$, the higher coolant velocities present above the viscous sublayer result in a lowering of pressure thereby promoting the initiation of nucleate boiling. For example, water at a velocity of 15 meters/sec. has a viscous sublayer thickness of about $5 \times 10^{-3}$ mm and a transition zone thickness of about $25 \times 10^{-3}$ mm. Heights of the protrusions above the heat exchange surface 84 may range from the thickness of the viscous sublayer to about ten times the combined thickness of the viscous sublayer and transition zone, i.e. 0.001 mm to 0.5 mm. Thus, temperature overshoot can be reduced by this cavity enhancement method.

Figure 5:
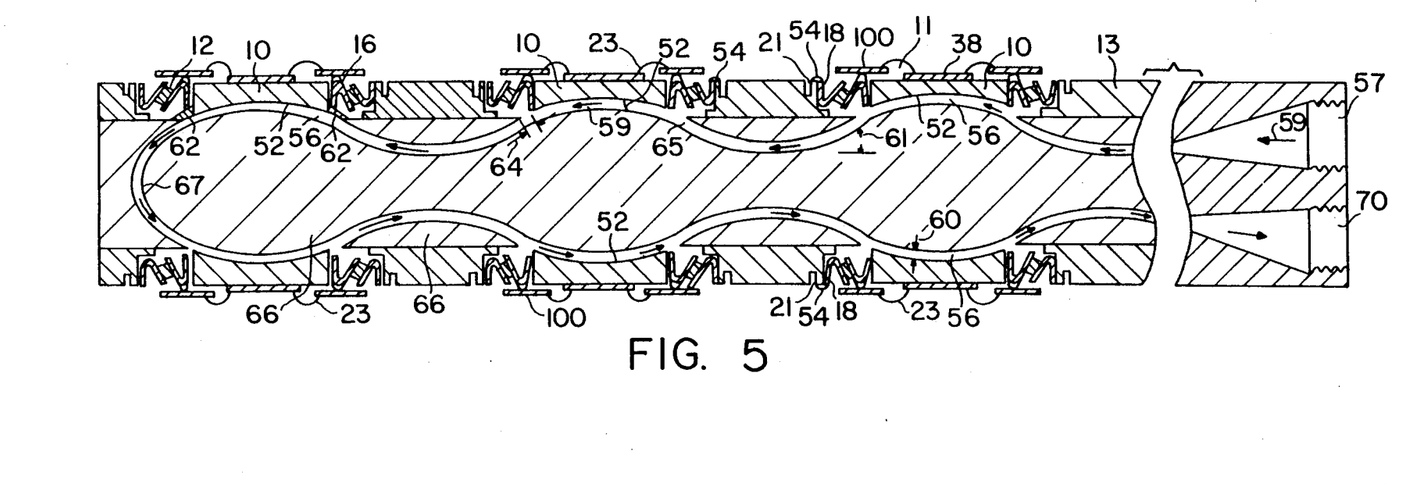
FIG. 5 is a cross section view of a semi-conductor module with multiple inserts and incorporating curved surface coolant flow.

Semi-conductor module 13, FIG. 5 is shown with several heat sink inserts 11 welded 54 into place. Shown is a linear array of inserts 11 on both sides of module 13 containing semi-conductor chips 38. Coolant 59 flows sequentially in series over each heat transfer surface 52. Coolant enters conduit 56 through port 57. Liquid cooled heat transfer surfaces 52 of substrate 10 have a macrocurvature with a radius of curvature 15 $r_1$. The flow of coolant 59 over macro-curved heat exchange surface 52 generates a centrifugal force, $v_1^2/r_1$, where $v_1$ is the velocity of the coolant and $r_1$ is the instantaneous radius of curvature of curved surface 52. In nucleate boiling heat transfer, the centrifugal force set up accelerates the nucleate bubbles away from the heated surface 52, and in addition, diminishes the size of the nucleate bubbles thereby enabling a greater population of nucleating bubbles per unit area before bubble coalescence, i.e. film boiling, which results in the critical heat flux and burn out. Both effects, higher bubble velocities directly away from the heat exchange surface and the higher nucleate bubble density, combine to increase both the heat flux and the critical heat flux as compared to linear flow cooling. Macro-curved surface cooling can produce a 4X to 5X increase in heat flux over linear flow for the same coolant velocities. Macro-curved surface cooling provides a more efficient mechanism of heat transfer thereby permitting the use of inefficient coolants, such as fluorocarbons, at high heat fluxes. Macro-curved heat exchange surface 52 may be prepared on substrate 10 by electrochemical grinding which provides a stress free member.

To minimize undesirable coolant flow characteristics such as cavitation in conduit 56, the transition from one insert 11 to the next should be as smooth and continuous as possible. This may be accomplished by causing conduit 56 to follow a serpentine path as shown in FIG. 5. Upon passing the trailing edge of a curved heat exchange surface 52, the path of serpentine conduit 56 commences to curve in the opposite direction. Thus, the maximum angle 61 traversed by the serpentine conduit 56 is approximately half that subtended by the arc of curved surface 52 (if circular) Serpentine conduit 56 does not have discontinuities or abrupt changes in direction. The coolant flow is therefore subject to a minimum path length and traverse a series of smooth shallow angle serpentine transitions which result in a minimum pressure drop and minimizing heat flux reducing effects such as cavitation, vortex shedding etc. at heat transfer surface 52. In general, angle 61 is less than 40°, usually being about 15° to 25°.

Figure 6:
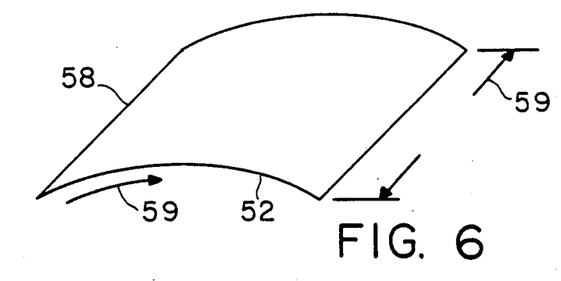
FIG. 6 illustrates the geometry of the curved liquid cooled heat exchange surface of the chip substrate.

The macro-curved surface 52 of substrate 10 is shown in FIG. 6 with the axis 58 orthogonal to curve 52. Coolant flow path 59 along axis 58 is linear and when combined with curve 52 represents a cylindrical surface. Coolant flow 59 is along curve 52 and orthogonal to 58. In general, the length 59A of 58 is slightly more than the combined length 46 of the semi-conductor chips 38 (FIG. 1A) along the same axis in order to insure an approximately uniform temperature along chip axis 46. Length 59A defines the width of the coolant conduit 56 and when multiplied by the coolant conduit height 60, conduit 56 cross-section is obtained.

Insert 62 is provided to bridge the gap 64 between module 13 wall 65 and heat sink insert 11 to insure smooth coolant flow. Insert 62 may be a non-conductor such as plastic, glass or ceramic if it touches substrate 10. Conduit 56 liner 66 may be a non-conductor such as plastic, glass or ceramic as might be used for microwave applications where it is desirable to minimize capacitive effects. For low frequency use, metal may be employed for liner 66 and insert 62 may also be metal as long as it does not touch, i.e. short circuit, substrate 10. Dielectric coolants such as fluorocarbons provide adequate electrical insulation between conduit liner 66 and insert 11.

Figure 7:
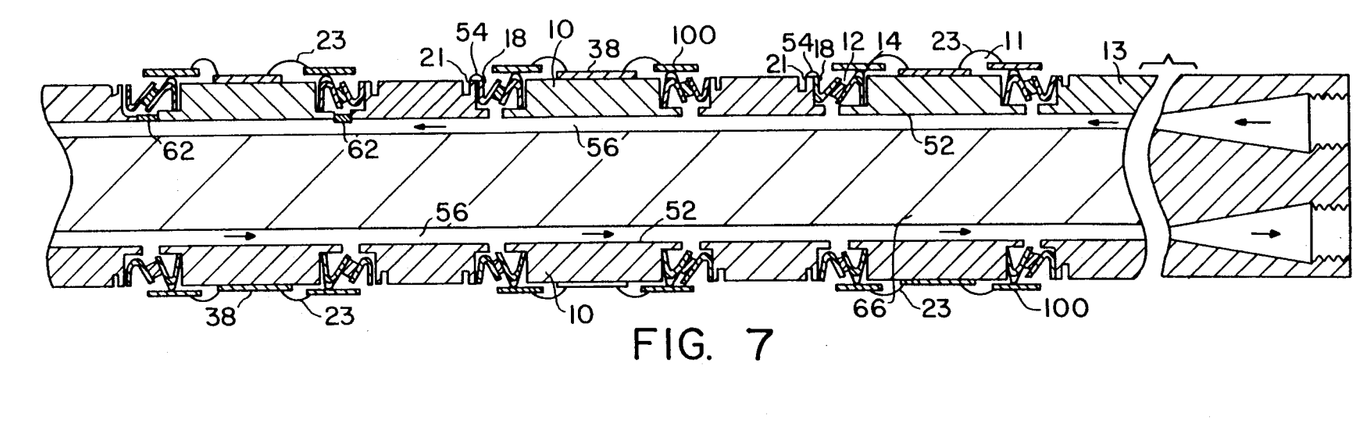
FIG. 7 is a cross section view of a semi-conductor module with multiple inserts and incorporating linear flow cooling of the heat exchange surfaces.

The heat sink inserts 11 are shown being cooled in series. As the coolant flow reaches the end of the module 13 it makes a 180° turn 67 in a smooth manner, e.g. a semicircle so as to minimize undesirable flow characteristics, and returns to cool the chips mounted on the opposing surface thence discharging through output port 70 to a heat exchanger whence it is recirculated. FIGS. 5 and 7 illustrate a linear array of inserts 11 on both sides of module 13. The module may be enlarged and have mounted on it parallel arrays of inserts 11, each independent linear array of inserts 11 being cooled by its own coolant conduit 56. Alternately, the parallel series of arrays may be cooled by a common conduit 56 by extending dimension 59 (FIG. 6) to include all arrays of inserts 11.

FIG. 7 illustrates a linear flow version of module 13 in FIG. 5. Heat exchange surface 52 of substrate 10 is shown linear in FIG. 7 instead of curved as in FIG. 5. Thus, the heat exchange surface 52 of substrate 10 is planar in FIG. 7 instead of concave cylindrical as in FIG. 5. Construction and preparation, e.g. protrusions 78 to generate micro-curved streamlines 74, of the heat sink inserts 11 would be the same as previously described for FIGS. 1, 2 and 8. For a given coolant flow, i.e. velocity, a linear flow system dissipates a lower heat flux, however, it is somewhat simpler to construct and may be suitable for some applications. In high volume production it is anticipated that the cost differences will be small. For multiple chip substrates 10 whose dimension in the direction of coolant flow is large, the geometry of heat exchange surface 52 in the direction of coolant flow may be a combination of curved and linear surface.

Figure 10:
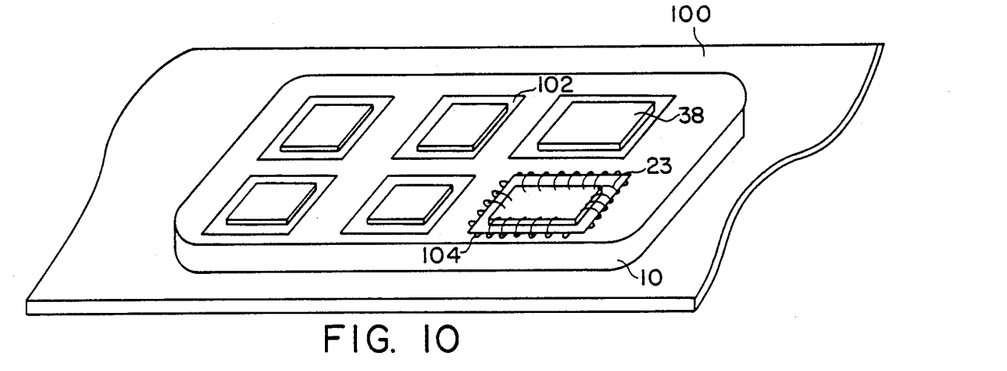
FIG. 10 is an angled view of a multi-chip insert with a lead bonded circuit board in position.

Shown in FIG. 10 is substantially rectangular substrate 10 with multiple semi-conductor chips 38 mounted thereon. To provide electrical interconnections between the various chips 38, various means may be employed. Means to make the electrical interconnections between semi-conductor chips 38 include the use of a multi-layer circuit board 100 having cutouts 102 corresponding to chips 38. Board 100 is provided with lead bond pads 104 to lead bond 23 connecting board 100 to chips 38. Since board 100 is installed after chips 38 are mounted to substrate 10, there are no high temperature operations that the board must face. Thus, the board material may be selected for optimum characteristic, e.g. dielectric constant, loss tangent, cost, etc. Board 100 may be mounted with adhesives to module 13 (see FIG. 12).

When inserts 11 containing multiple chips 38 are sealed into module 13, board 100 may be restricted in size and electrical interconnects to the chips 38 on each insert 11 with the adjacent boards connected by cable. Alternatively, a single board 100 may span the length of module 13, and width if there is a two dimensional array of inserts 11, thereby directly interconnecting all chips on one surface of module 13. A second similar board is then placed on the opposing surface of module 13 thereby providing electrical interconnections to chips 38 on said opposing surface.

Figure 11:
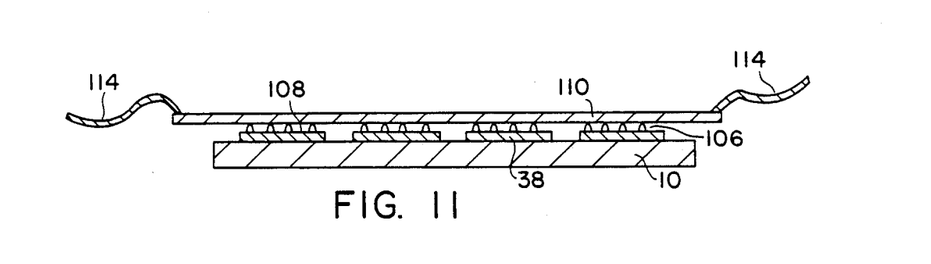
FIG. 11 is a cross section view of a multi-chip insert with a solder bump circuit board in position.

A further means whereby chips 38 mounted on inserts 11 may be electrically interconnected is by the well-known solder bump technique, shown in FIG. 11, wherein chips 38 are prepared with solder bumps 106 appropriately placed, for example, on the exposed surface 108 of chips 38 thereby providing the junctions for electrical connections. Circuit board 110, which may be multilevel, has its interconnect pads properly positioned over solder bumps 106 and the entire structure is then heated to melt solder bumps 106 thereby electrically connecting chips 38 to board 110. As before, board 110 may be made small and limited to electrically interconnect the chips 38 on each insert with adjacent boards connected by cable 114. Alternatively, board 110 may span the length, and width if there is a 2 dimensional array of inserts 11, of the surface of module 13, thereby electrically connecting all chips on one surface. That is, two boards are required, one for each side of module 13.

A major concern regarding semi-conductor reliability is device degradation due to moisture or other environmental contaminants reaching chips 38 and degrading performance during life. Hermetically sealing chip 38 from the outside environment provides the ideal solution. Instead of sealing or encapsulating each chip as is presently done in integrated circuit manufacture, the entire module 13 is sealed in a single step in the present invention. this improves reliability, simplifies fabrication, provides easy access for defective chip replacement and lowers manufacturing costs. By sealing all chips 38 on module 13 within a single structure, the cumulative expense of individually sealing and testing each insert 11 is avoided.

Figure 12:
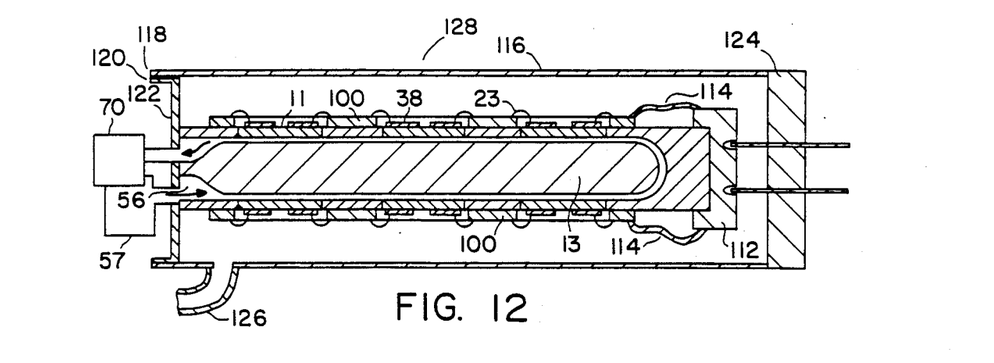
FIG. 12 is a cross section view of a semi-conductor module hermetically sealed in a can.

FIG. 12 illustrates a sealed module assembly 128 comprising module 13 with chips 38 mounted on inserts 11, said chips being electrically interconnected by circuit board 100, and can 116 with hermetic connector 124 enclosing module 13. Mounted on the end of module 13 is means, e.g. pin connector 112 electrically connected to boards 100 by means such as ribbon cable 114. Can 116 which encloses and is preferably a close fit to module 13 is slid over module 13 until lip 118 engages lip 120 of flange 122 mounted on module 13. Hermetically sealed electrical connector 124 is mounted on the other end of can 116, connector 124 engaging connector 112 upon insertion of module 13 into can 116. Upon the sealing of lips 120 and 118 by, for example, with heliarc, laser or electron beam welding, a hermetic seal is effected completely enclosing module 13 within can 116. Pump out tubulation 126, e.g. copper, attached to can 116 permits can 116 to be evacuated with a vacuum pump and leak tested with a helium leak detector, one of the most sensitive methods known. Can 116 is provided with means such as ribs to prevent deformation during evacuation. Upon checking to be vacuum tight, the sealed module assembly may be vacuum baked at moderate temperatures to drive out moisture and other low vapor pressure contaminants. Upon completion of this cycle, pump out tubulation 126 may be sealed off, i.e. pinched off, with the interior of can 116 evacuated, or can 116 can be back filled with a suitable gas such as argon or dry nitrogen and then tubulation 126 is sealed off. The weld joint made at lips 118, 120 may be removed by grinding away the welded area thereby permitting removal of module 13 from can 116 for repairs etc. Upon completion of repairs and reassembly of module 13 and can 116, lips 118, 120 may again be welded using either the same can 116, or a new one. Inserts 11 may also be removed (and replaced) from module 13 in the same manner, e.g. by grinding the weld joint at lips 14 and 54. Other means to seal module 13 within can 116 include using elastomer "O" rings or gaskets, and replacing pump out tubulation 126 with a valve.

Figure 13:
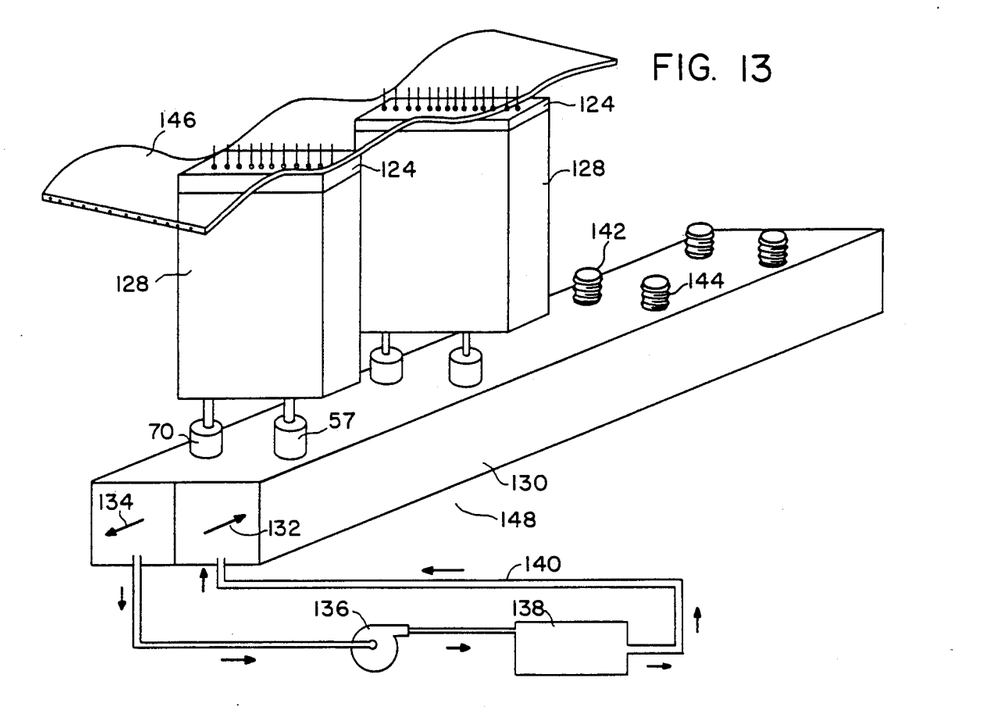
FIG. 13 is an angled view of a computer subsystem comprising multiple sealed modules and electrical connections mounted on a closed loop heat exchanger.

FIG. 13 illustrates computer sub-system 148 wherein multiple sealed module assemblies 128 may be mounted on common coolant conduit 130 which provides for both input 132 and discharge 134 flow of coolant. Pump 136, heat exchanger 138 and hoses or piping 140 complete the closed loop coolant circuit. Input 144 and discharge 142 couplers mounted on conduit 130 connect to like couplers 57 and 70 of module assemblies 128. Thus, coolant is introduced and discharged in parallel to module assemblies 129 mounted on conduit 130. Assemblies 128 may be interconnected by cable 146. One or more sub-systems 148 may comprise the computational elements of a powerful computer. Module assemblies 128 incorporating curved surface cooling may be designed to dissipate from a kilowatt to in excess of 10 kilowatts of power and computer sub-systems 148 can dissipate from less than 10 KW to in excess of 100 KW.

The removal and replacement of defective chips 38 or other components bonded to substrate 10 presents difficulties in that in heating the defective chip care must be taken so that adjacent good chips are not also heated to the point where their braze bonds are broken. A means whereby this may be accomplished is to provide an intense, highly localized source of heating that melts the braze joint of the defective chip so quickly that adjacent chips do not get hot enough to have their braze joints effected. In like manner, the replacement chip can be quickly heated and brazed or soldered to the substrate before adjacent chips brazed become too hot. To further assist in the chip removal and replacement, without affecting neighboring "good" chips, the heat exchange surface 52 of substrate 10 corresponding to the adjacent "good" chips may have a heat sink, e.g. a wet cloth, in contact with the desired surfaces thereby further protecting the braze joint of the "good" chips.

Figure 14:
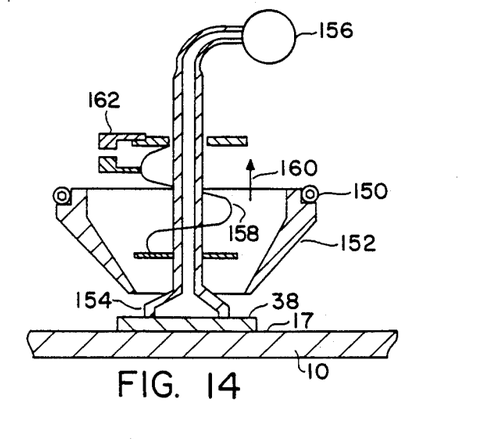
FIG. 14 is a miniaturized RF concentrator assembly and chip removal means.

Means whereby a short, intense, localized heating to remove a defective chip may be obtained is shown in FIG. 14. Small AC induction coil 150 which may be an RF frequency, is attached to miniaturized AC concentrator 152, e.g. copper. The operating frequency of the induction coil may preferably be in the RF region. Operating frequency is determined by the geometry of the desired localized heating and the required geometry of the induction coil, e.g. RF and concentrator, e.g. RF. The operating frequency of the AC coil may range from 1 kilocycle to 500 megacycles. Semi-conductor chip attaching means 154 is encompassed by AC concentrator 152. Attaching means 154 may utilize a suction method, e.g. a lowered pressure generated by a small vacuum pump 156, to attach to chip 38. attaching means 154 is non-conductive, e.g. plastic, ceramic etc. Means 158, e.g. a spring, to generate an upward force 160 is provided to lift chip 38 from substrate 10 immediately upon melting of the braze or solder joint 17. Other means to generate an upward force include pneumatic, hydraulic, magnetic and counterweight. Upward force 160 does not exceed the force provided by vacuum hold-down 154. Upon lifting chip 38 free from substrate 10, means 162 are provided, e.g. an electrical contact, that shuts off the RF power. The RF coil 150 and concentrator 152 provide an intense, localized source of heat, the intensity being set at less than that needed to crack or shatter chip 38. Vacuum attaching device 154 combined with upward force 160 serves to promptly remove chip 38 from substrate 10 upon melting of braze joint 17.

It will be understood that the above description is of preferred exemplary embodiments of the present invention and that the invention is not limited to the specific forms shown. Modifications may be made in design and arrangements of the elements without departing from the spirit of the invention as expressed in the appended claims.

We claim:

1. A heat transfer apparatus comprising a heat exchange surface and an opposing heated surface which is exposed to a heat flux, said heat exchange surface being exposed to a flow of nucleate boiling liquid, said heat exchange surface having nucleate boiling cavity sites disposed thereon, said nucleate boiling cavity sites including means for creating curved streamlines over said nucleate boiling cavity sites, said curved streamlines creating a zone of reduced pressure at said cavities thereby lowering the initiating superheat required to induce nucleate boiling at said nucleate boiling cavity sites.

2. The apparatus of claim 1 wherein said means for creating streamlines comprises a plurality of protrusions, each of said protrusions substantially encompassing one of said cavities, said protrusions extending from said heat exchange surface and forming a concave surface therewith.

3. The apparatus of claim 2 wherein said protrusions range from approximately .001 mm to 0.5 mm in height.

4. The apparatus of claim 1 wherein said heat exchange surface further comprises a plurality of protrusions substantially encompassing said nucleate boiling site cavities, said protrusions ranging from 0.001 mm to 0.5 mm in height.

5. The apparatus of claim 1 wherein said heat exchange surface further comprises undulations in the direction of coolant flow, said undulations having a peak-to-peak height ranging from .001 mm to 0.5 mm and a period ranging from 0.005 mm to 5 mm.

6. A heat exchange system comprising:
   a heat exchange liquid;
   a substrate having a heat exchange surface disposed for thermal communication with said heat exchange liquid and an opposing heated surface which is exposed to a heat flux; and
   means for generating a flow of said liquid over said heat exchange surface at a predetermined velocity;

said heat exchange surface comprising boiling means for inducing nucleate boiling of said liquid proximate said heat exchange surface, said boiling means comprising:

a plurality of nucleate boiling cavity sites disposed on said heat exchange surface;

means for inducing curved streamlines within said liquid proximate said cavity sites to thereby induce nucleate boiling of said liquid at a predetermined temperature.

7. The system of claim 6 wherein said liquid is a dielectric liquid.

8. The system of claim 6 wherein said liquid is a fluorocarbon liquid.

9. The apparatus of claim 5, wherein said undulations comprise a continuous series of alternating concave and convex curved surfaces spaced apart along the direction of said coolant flow and extending in a direction transverse to said direction of said coolant flow.

10. The system of claim 6, wherein said boiling means further comprises a concave curved surface disposed about at least one of said cavity sites such that, when said liquid flows over said cavity sites, a zone of reduced pressure is created over said at least one of said cavity sites.

11. The system of claim 6, wherein said boiling means further comprises means for creating a Bernoulli effect proximate at least one of said cavity sites to thereby reduce the pressure over said at least one cavity site.

12. The system of claim 6, wherein said heat exchange surface further comprises a series of alternating curved peaks and valleys spaced apart along the direction of said liquid velocity and extending along a direction transverse to said direction of said liquid velocity.

* * * * *